United States Patent
Welsch et al.

(10) Patent No.: US 11,158,549 B2
(45) Date of Patent: Oct. 26, 2021

(54) METHOD, CONTROL SYSTEM AND PLANT FOR PROCESSING A SEMICONDUCTOR WAFER, AND SEMICONDUCTOR WAFER

(71) Applicant: SILTRONIC AG, Munich (DE)

(72) Inventors: Stefan Welsch, Polling (DE); Christof Weber, Burghausen (DE); Axel Beyer, Burghausen (DE)

(73) Assignee: SILTRONIC AG, Munich (DE)

( * ) Notice: Subject to any disclaimer, the term of this patent is extended or adjusted under 35 U.S.C. 154(b) by 80 days.

(21) Appl. No.: 16/624,540

(22) PCT Filed: Jun. 5, 2018

(86) PCT No.: PCT/EP2018/064735
§ 371 (c)(1),
(2) Date: Dec. 19, 2019

(87) PCT Pub. No.: WO2018/234030
PCT Pub. Date: Dec. 27, 2018

(65) Prior Publication Data
US 2020/0126876 A1 Apr. 23, 2020

(30) Foreign Application Priority Data

Jun. 21, 2017 (DE) .......................... 102017210423.6

(51) Int. Cl.
*H01L 21/66* (2006.01)
*B24B 37/005* (2012.01)
(Continued)

(52) U.S. Cl.
CPC ............ *H01L 22/26* (2013.01); *B24B 37/005* (2013.01); *B24B 37/042* (2013.01);
(Continued)

(58) Field of Classification Search
None
See application file for complete search history.

(56) References Cited

U.S. PATENT DOCUMENTS 6,299,514 B1  10/2001  Boller
2003/0054650 A1  3/2003  Wenski et al.
(Continued)

FOREIGN PATENT DOCUMENTS

DE       10007390 A1    10/2000
DE    102005045339 A1     4/2007
(Continued)

OTHER PUBLICATIONS

JP 6128198 A2, English Abstract.
(Continued)

*Primary Examiner* — Alexander G Ghyka
(74) *Attorney, Agent, or Firm* — Brooks Kushman P.C.

(57) ABSTRACT

Semiconductor wafers, are processed using minimally three processing operations: a first double-sided polishing operation, a second chemical-mechanical polishing operation and an epitaxial coating operation. A control system for conducting the method defines at least one operating parameter for the processing operations specifically based on at least one wafer parameter measured on the semiconductor wafer after processing in at least one processing operation, based on an actual state of a processing apparatus with which the respective processing operation is conducted, and based on optimizing wafer parameters for flatness after the wafer has undergone all three processing operations instead of optimizing each individual processing step for optimal flatness.

14 Claims, 8 Drawing Sheets

(51) Int. Cl.
  *B24B 37/04* (2012.01)
  *H01L 21/02* (2006.01)
  *H01L 21/306* (2006.01)
  *H01L 21/3065* (2006.01)

(52) U.S. Cl.
  CPC .... *H01L 21/02024* (2013.01); *H01L 21/0262* (2013.01); *H01L 21/02532* (2013.01); *H01L 21/02661* (2013.01); *H01L 21/3065* (2013.01); *H01L 21/30625* (2013.01)

(56) References Cited

U.S. PATENT DOCUMENTS

| | | | |
|---|---|---|---|
| 2007/0066036 | A1 | 3/2007 | Schauer et al. |
| 2007/0066082 | A1 | 3/2007 | Schauer et al. |
| 2008/0036040 | A1 | 2/2008 | Wagner et al. |
| 2009/0269861 | A1 | 10/2009 | Kurosawa |
| 2010/0056027 | A1 | 3/2010 | Zapilko et al. |
| 2014/0008768 | A1 | 1/2014 | Sato |
| 2017/0301533 | A1* | 10/2017 | Miyazawa ............. B24B 49/04 |
| 2018/0036864 | A1* | 2/2018 | Kawasaki ......... H01L 21/30625 |
| 2018/0342383 | A1 | 11/2018 | Roettger et al. |
| 2019/0115205 | A1* | 4/2019 | Lin .................. H01L 21/02019 |
| 2019/0348270 | A1* | 11/2019 | Morita .................... B24B 9/00 |
| 2020/0039021 | A1* | 2/2020 | Kubota ................ H01L 21/304 |

FOREIGN PATENT DOCUMENTS

| | | |
|---|---|---|
| DE | 102007021729 B3 | 10/2008 |
| DE | 102008045534 A1 | 3/2010 |
| DE | 102015224933 A1 | 6/2017 |
| JP | 200788473 A | 4/2007 |
| JP | 6128198 A2 | 5/2017 |
| TW | 201306109 A | 2/2013 |
| TW | 201708632 A | 3/2017 |
| WO | 2016170721 A1 | 10/2016 |

OTHER PUBLICATIONS

JP 2007088473 A, US 2007/066082 A1.
DE 10007390 A1, US 6299514 B1.
DE 10 2008 045 534 A1, US 2010/0056027 A1.
DE 10 2005 045 339 A1, US 2007/0066036 A1.
DE 10 2007 021 729 B3, English Patent Abstract.
DE 10 2015 224 933 A1, US 2018/0342383 A1.
TW 201708632 A & WO 2016/170721 A1, English Patent Abstract.
TW 201306109 A, US 2014/0008768 A1.

* cited by examiner

METHOD, CONTROL SYSTEM AND PLANT FOR PROCESSING A SEMICONDUCTOR WAFER, AND SEMICONDUCTOR WAFER

CROSS REFERENCE TO RELATED APPLICATIONS

This application is the U.S. National Phase of PCT Appln. No. PCT/EP2018/064735 filed Jun. 5, 2018, which claims priority to German Application No. 10 2017 210 423.6 filed Jun. 21, 2017, the disclosures of which are incorporated in their entirety by reference herein.

BACKGROUND OF THE INVENTION

1 Field of the Invention

The present invention relates to a method of processing a semiconductor wafer, to a control system for controlling processing apparatuses for processing a semiconductor wafer, to a plant for processing a semiconductor wafer having such processing apparatuses and such a control system, and to a semiconductor wafer processed thereby.

2. Description of the Related Art

Semiconductor wafers, especially silicon wafers, are suitable, for example, for use in the semiconductor industry, especially for fabrication of highly integrated electronic components, for example microprocessors or memory chips. For modern microelectronics, starting materials, called "substrates," having high demands on global and local flatness, edge geometry, thickness distribution, single side-based local flatness, "nanotopology," and freedom from defects are required.

In order to obtain semiconductor wafers having such properties, these semiconductor wafers can be subjected to various processing operations. These especially include double-sided polishing ("DSP"), in which both sides of a semiconductor wafer are processed simultaneously with removal of material in one processing step by means of two working surfaces, preferably in such a way that the processing forces that act on the front and back sides of the semiconductor wafer during the removal of material are essentially in balance and no constraining forces are exerted on the semiconductor wafer by a guide apparatus, i.e. the semiconductor wafer is processed in a "free-floating" manner. In this context, it is especially possible for multiple semiconductor wafers to be inserted into one or more "carrier plates" having recesses for the semiconductor wafers, and then to be polished by forces acting on both sides of the semiconductor wafers. DSP processing of silicon wafers is described, for example, in US 2003/054650 A1, and an apparatus suitable therefor in DE 100 07 390 A1.

A useful further processing operation is chemical-mechanical polishing ("CMP"), as known, for example, from DE 10 2008 045 534 B4. In this case, a semiconductor wafer is pressed by means of a carrier onto a polishing pad (which may be on a polishing plate) and then moved, usually with rotation, under pressure. Through the use of a suitable polishing medium or a polishing medium suspension, one side of the semiconductor wafer is then polished.

A useful further processing operation is a coating operation as known, for example, from DE 10 2005 045 339 A1. In epitaxial coating of semiconductor wafers, for example, in an epitaxial reactor, a deposition gas is passed through the epitaxial reactor, as a result of which material can be epitaxially deposited on a surface of the semiconductor wafers. However, apart from on the semiconductor wafers, the material is also deposited within the epitaxial reactor. It is therefore typically necessary to remove such residues that have been deposited in an uncontrolled manner on surfaces in the epitaxial reactor during the deposition, from time to time.

In order to obtain the best possible semiconductor wafers, i.e. those that very substantially meet the abovementioned demands, it is customary to optimize each of these processing operations with regard to the operating parameters in order to obtain the best possible result in each of these processing operations.

Against this background, the problem addressed is that of specifying a way of obtaining even better semiconductor wafers, especially with regard to the flatness of their surfaces.

SUMMARY OF THE INVENTION

The invention pertains to a method, a control system and a plant, and also a semiconductor wafer, the method having three processing operations, comprising a first polishing operation in which the semiconductor wafer is subjected to double-sided polishing (DSP), followed by a second polishing operation in which the semiconductor wafer is subjected to chemical-mechanical polishing (CMP), followed by a coating operation in which the semiconductor wafers are subjected to epitaxial deposition of a layer, wherein in order that at least one wafer parameter is within a desirable range of values after undergoing all three processing operations, at least two operating parameters belonging to different processing operations are defined dependently on one another.

DETAILED DESCRIPTION OF THE PREFERRED EMBODIMENTS

Figure 1:
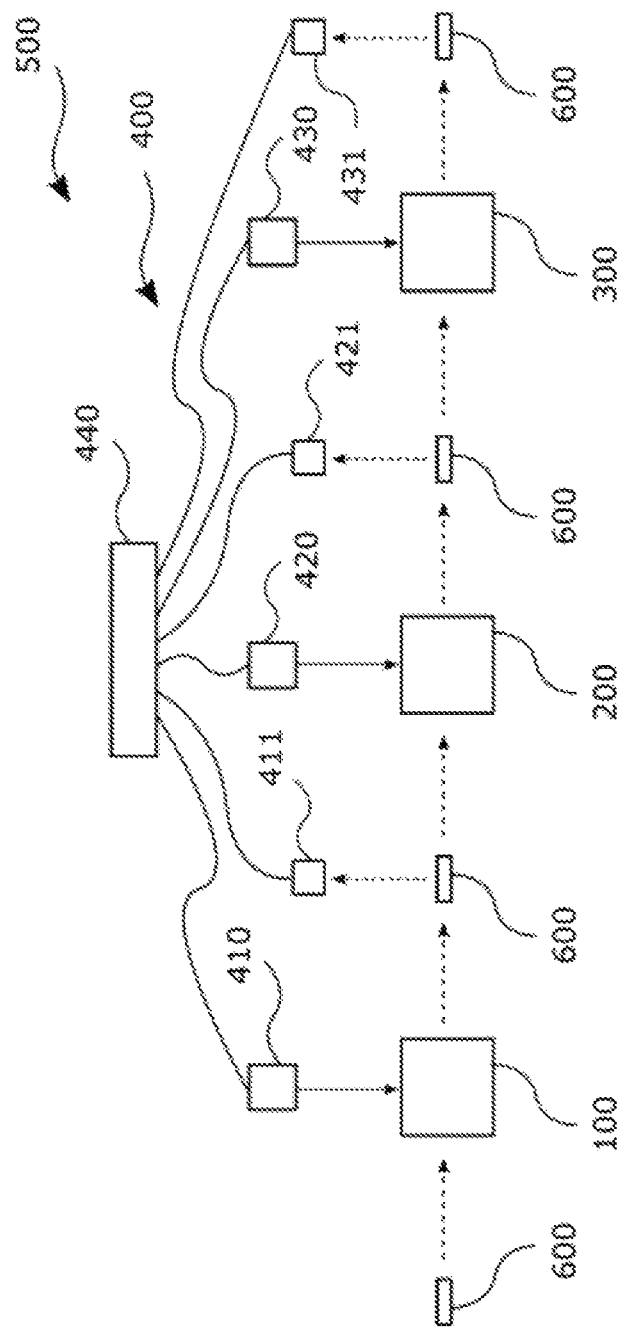
FIG. 1 shows a schematic of a plant of the invention in a preferred embodiment, with which a method of the invention can be performed.

For the individual processing operations, it is possible to use suitable processing apparatuses. A useful first polishing apparatus for the first polishing operation is, for example, one having an upper polishing plate and a lower polishing plate, each rotatable about a common axis of rotation, and rotor disks arranged between the upper and lower polishing plates to accommodate semiconductor wafers. The faces of the upper and lower polishing plates facing the semiconductor wafers may each be aligned planar and parallel to one another. A polishing pad may have been applied to each of the faces of the upper and lower polishing plates facing the semiconductor wafers. In general, it is customary here to process or polish multiple semiconductor wafers in one run in such a polishing operation.

For the second polishing operation, an example of a useful second polishing apparatus is one having a polishing plate with a polishing pad disposed thereon. In addition, a carrier may be provided, with which a force can be applied to a semiconductor wafer lying on the polishing pad. The semiconductor wafer can be moved here along the polishing pad by means of the carrier, which can especially rotate about its own central axis. It is possible here to add a suitable polishing medium or a polishing medium suspension. In such a polishing operation, typically just a single semiconductor wafer is processed or polished in one run.

For the coating operation, an example of a useful coating apparatus, especially an epitaxial reactor, is one in which a semiconductor wafer can be applied to a susceptor. A deposition gas can then be passed through the coating apparatus for coating of the semiconductor wafer. In addition, before passing deposition gas through, an etching gas can be passed through the coating apparatus in order to remove any deposits in the coating apparatus. In such a coating operation, it is entirely customary to coat just a single semiconductor wafer in one run.

Between, before or after these three processing operations, it is also possible for further processing operations to take place, but these have at least no significant effect, if any, on the flatness of the semiconductor wafer.

What is now envisaged in accordance with the invention is that, in order that at least one wafer parameter is within a desirable range of values after undergoing all three processing operations, at least two operating parameters belonging to different processing operations are defined dependently on one another.

More particularly, this can also be accomplished indirectly in that, in at least one of the processing operations, at least one corresponding operating parameter is defined based on a value of at least one wafer parameter after undergoing at least one of the other processing operations, where this wafer parameter in turn depends on at least one operating parameter of this other processing operation. In this way, the exact dependence of the operating parameters on one another can be obtained by, for example, measuring the wafer parameter.

Operating parameters to be considered here are especially various quantities which can be established in the respective processing operation. These may, for example, be pressures or a pressure distribution in a polishing operation or a volume or mass flow rate of deposition gas or etching gas in the coating operation. Especially in the second polishing operation, the pressure distribution may comprise different pressures for various radii of the semiconductor wafer, as will be elucidated in detail below. In both polishing operations, in addition, speeds of rotation and/or polishing times can also be established.

A wafer parameter is understood to mean a parameter or a quantity which can be used to assess a semiconductor wafer, especially with regard to its quality. For examples of such wafer parameters, reference is made to the elucidations which follow.

It was recognized that, by taking account of interactions between the various processing operations, it is possible to achieve distinctly better results, especially with regard to the flatness of the semiconductor wafers, than in the case of optimization of every individual processing operation on its own. This is especially attributable to the fact that a consideration of interactions between various processing operations especially also includes ranges for operating parameters in the individual processing operations that would not be taken into account in the individual processing operation in themselves owing to significant deviations from the process optimum. For example, in the case of the second polishing operation, greater removal of material at the outer edge of a semiconductor wafer can be accepted or else deliberately established if higher application of material to the semiconductor wafer at the outer edge is to be expected or can be deliberately established in the later coating operation. It is also possible to define an operating parameter depending on a desired value of the at least one wafer parameter after a subsequent processing operation, as will be elucidated later on. In that case, the result of a polishing operation will, for example, no longer be that the semiconductor wafer has maximum flatness, but that it constitutes a good starting material for the subsequent processing operation, but if appropriate with a desirable profile.

It is likewise possible to take account of the circumstance that arises in the coating operation that material is deposited at different speeds in the edge region depending on the polar angle. For example, an epitaxial layer of monocrystalline silicon grows more quickly at polar angle positions of 0°, 90°, 180° and 270° than at polar angle positions offset by 45° relative to the positions mentioned on a {100}-oriented semiconductor wafer of monocrystalline silicon having an orientation notch that indicates a <110> direction. The 0° position denotes the notch position. The thickness of the coated semiconductor wafer is therefore greater in four regions of the circumference at equal distances from one another than in the regions in between (called fourfold symmetry).

At least one operating parameter for each of the three processing operations is defined in the respective processing operation, specifically based on at least one wafer parameter which is determined on the semiconductor wafer to be processed;

based on an actual state of a processing apparatus with which the respective processing operation is conducted; and preferably based on an optimization of the wafer parameters $ESFQR_{max}$, $SFQR_{max}$, $ZDD_{av}$ and GBIR with regard to the condition thereof after undergoing the three processing operations instead of an optimization of these wafer parameters with regard to the condition thereof after every individual processing step of the three.

The inventors thus propose defining operating parameters for the processing operations such that the wafer parameters $ESFQR_{max}$, $SFQR_{max}$, $ZDD_{av}$ and GBIR that characterize the flatness have been optimized after the three processing operations, i.e. are within a range of target values.

The at least one wafer parameter which is determined on the semiconductor wafer to be processed is preferably obtained from raw data from a flatness measurement. In principle, therefore, $ESFQR_{max}$ and $SFQR_{max}$, for example, are suitable as wafer parameters to be determined. Preferably, the wafer parameter to be determined has the property that the magnitude and sign of the deviation from a reference, for example a reference plane or a reference line, can be taken therefrom. For this reason, $ESFQD_{av}$ is preferably chosen as the wafer parameter to be determined. The acronym ESFQD stands for "Edge Site Frontsurface-referenced least sQuares/Deviation", and the index av denotes the average of the ESFQD values of edge sites in the circumferential region of the semiconductor wafer. Typically, the circumferential region comprises 72 sites of this kind (sectors).

In the manner proposed, it is possible to obtain semiconductor wafers having much better values with regard to the demands stated at the outset. More particularly, what is made available is a semiconductor wafer having an $ESFQR_{max}$ value at an edge exclusion of 2 mm, an edge division into 72 sectors and a sector length of 30 mm not greater than 10 nm, having an $SFQR_{max}$ value at an edge exclusion of 2 mm and a site area of 26 mm×8 mm not greater than 10 nm, having a $ZDD_{av}$ value at a radius position of 148 mm having a magnitude not greater than 10 nm/mm$^2$, and having a GBIR value at an edge exclusion of 2 mm not greater than 0.10 µm. The invention also provides a semiconductor wafer of this kind, especially in the form of a monocrystalline silicon wafer with an epitaxial layer of monocrystalline silicon. The semiconductor wafer preferably has {100} orientation or {110} orientation and preferably has a diameter of not less than 300 mm.

$ZDD_{av}$ ("Z-Height Double Differentiation") describes the mean of the curvature of the edge region of a front side of the semiconductor wafer. The front side is that side coated with an epitaxial layer. SFQR stands for "Site Frontsurface-referenced least sQuares/Range", and the value thereof indicates the flatness of the semiconductor wafer. $SFQR_{max}$ denotes the greatest SFQR value of sites that are not edge sites. More particularly, this correlates positive and negative deviations of a surface from a flat reference surface. In general, the deviations are each used for the calculation for an area having particular dimensions at the surface of the semiconductor wafer. ESFQR stands for "Edge Site Frontsurface-referenced least sQuares/Range", and the value thereof is defined as for the SFQR value, but only for edge sites of the semiconductor wafer. $ESFQR_{max}$ denotes the greatest ESFQR value of the edge sites. GBIR stands for "Global Backside Indicated Reading". All these values are particularly sensitive with regard to radial and polar angle-dependent inhomogeneities.

Definitions and test methods for the wafer parameters mentioned are present in the standards SEMI M67 (ESFQR and ESFQD), SEMI M1, SEMI MF1530 and SEMI M49 (SFQR and GBIR), and SEMI M68 (ZDD).

For each of the processing operations, at least one corresponding operating parameter based on a determined value for at least one wafer parameter after undergoing at least one preceding processing operation is defined. In this way, more particularly, any disadvantageous values can be compensated for by a subsequent processing operation, in order thus to obtain a particularly good value for the wafer parameter.

The at least one operating parameter which belongs to the first polishing operation and is established is preferably selected from a group comprising a polishing pressure, a polishing time, a speed of rotation of an upper polishing plate, a speed of rotation of a lower polishing plate, a speed of rotation of an inner drive ring, a speed of rotation of an outer drive ring, a temperature of the upper polishing plate, a temperature of the lower polishing plate, a composition of a polishing medium, a volume flow rate of the polishing medium, a temperature of the polishing medium, a pH of the polishing medium and a target differential of central thickness of the polished semiconductor wafer and mean thickness of the rotor disk used for polishing (negative target differential=deficiency (negative jut-out), positive target differential=excess (positive jut-out)).

It is particularly advantageous when, for the second polishing operation, the at least one corresponding operating parameter is defined based on the value of the at least one wafer parameter after undergoing the first polishing operation. It is likewise also advantageous when, for the coating operation, the at least one corresponding operating parameter is defined based on the value of the at least one wafer parameter after undergoing the second polishing operation. In general, it is possible in this way to achieve particularly flat or even semiconductor wafers that would not be achievable especially without taking account of results across the different processing operations.

For each of the processing operations, at least one corresponding operating parameter is defined based on target values for the wafer parameters $ESFQR_{max}$, $SFQR_{max}$, $ZDD_{av}$ and GBIR after undergoing the three processing operations. It is thus possible not just to compensate for any disadvantageous values with a subsequent processing operation, but it is also possible to deliberately define deviations that can be compensated for again particularly well, for example, with one of the downstream processing operations.

It is advantageous when, for each of the three processing operations, the at least one corresponding operating parameter is defined individually for a single semiconductor wafer, especially based on a value for the at least one wafer parameter of the respective semiconductor wafer after undergoing at least one other processing operation. By means of such individual setting or definition of operating parameters, especially based on a wafer parameter which is determined prior to the respective processing operation on the semiconductor wafer to be processed, or based on target values of the wafer parameters $ESFQR_{max}$, $SFQR_{max}$, $ZDD_{av}$ and GBIR, after undergoing the three processing operations, it is possible to obtain distinctly more even or flatter semiconductor wafers than by the definition that has been customary to date of a fixed processing recipe in the respective processing step for a multitude of semiconductor wafers. Another reason for this is, for example, that the processing apparatus can also change with the processing of a semiconductor wafer, for example as a result of wear on polishing pads or deposition of coating material, which can be taken into account particularly well by the individual definition in the context of this invention.

It is appropriate when the value for the at least one wafer parameter to be determined in the respective semiconductor wafer is measured and/or ascertained using an evaluation (e.g. average, inter- and/or extrapolation) based on a multitude of semiconductor wafers. A measurement with a suitable measurement apparatus, for example by capacitative or interferometric scanning, is useful especially in the case of those processing operations in which just one semiconductor wafer is processed per run. In the case of simultaneous processing of multiple wafers, by contrast, an evaluation (according to the situation) (for example average, inter- and/or extrapolation) based on a multitude of semiconductor wafers is especially also an option. This is especially appropriate in the case of DSP processing, i.e. the first polishing operation, since it is possible in this way to distinctly reduce the measurement complexity, while sufficiently accurate values can nevertheless be obtained by an inter- or extrapolation.

Also taken into account is the actual state of the processing apparatus with which the respective processing operation is conducted. Preferably, for this purpose, the at least one wafer parameter which is determined on the semiconductor wafer to be processed is determined again after it has undergone the respective processing operation. The wafer parameter that has been determined again is then also taken into account when the task at hand is to define the at least one corresponding operating parameter for the processing of a subsequent semiconductor wafer in the respective processing operation. The basis of the definition of the at least one operating parameter may also be a wafer parameter which has been determined using a number of previously processed semiconductor wafers. For example, it is thus possible to specifically take account of any wear phenomena or other changes, particularly measurable changes, in a processing apparatus that affect the processing of the semiconductor wafer, in order thus to improve the flatness of the semiconductor wafer achievable overall.

Advantageously, for the second polishing operation (i.e. for CMP), the at least one operating parameter is defined in such a way that regions of the semiconductor wafer in a radial direction are affected to different degrees in the processing; more particularly, regions of the semiconductor wafer that are further radially outward are more strongly affected than regions that are further radially inward. This can be accomplished in each case especially by defining and applying different pressures onto the regions of the semiconductor wafer. Such different pressures can be generated, for example, by a suitably designed carrier (or polishing ram) of the corresponding processing apparatus, by means of which the pressure is exerted on the semiconductor wafer. It is thus possible to define the pressure specifically for individual regions of the semiconductor wafer. It is possible here to define recipes (for the operating parameters) individually for every semiconductor wafer, which are additionally also material-specific (for example for the material of the semiconductor wafer) and specific for the respective processing apparatus (for example the condition of the polishing pad).

The at least one operating parameter which belongs to the second polishing operation and is established is preferably selected from a group comprising a radial distribution of a polishing pressure, a polishing time, a speed of rotation of a polishing plate, a speed of rotation of a carrier, a composition of a polishing medium, a volume flow rate of the polishing medium, a pH of the polishing medium, a temperature of the polishing plate, a temperature of the polishing medium and a dressing of a polishing pad.

It is advantageous when the coating operation comprises passing an etching gas through the coating apparatus prior to passing a deposition gas through a coating apparatus in which the semiconductor wafer is disposed, and wherein the at least one operating parameter defines a value for the flow (e.g. volume flow rate, mass flow rate, etching or deposition time or the like) of the deposition gas and/or the etching gas. It is thus possible to very accurately influence the coating, it being possible by the prior passage of etching gas to at least partly remove any deposits which affect, for example, the gas flow and temperature distribution on the semiconductor wafer and hence the coating of the semiconductor wafers. It is especially also conceivable here to choose the duration during which the etching gas and/or the deposition gas are passed through as an operating parameter. The etching gas preferably consists of a mixture of hydrogen chloride and hydrogen, although the etching gas may also consist of hydrogen chloride only or of hydrogen only.

The at least one operating parameter which belongs to the coating operation and is established is preferably selected from a group comprising a volume flow rate of a deposition gas, a temperature of the deposition gas, a composition of the deposition gas, a duration of the deposition of the epitaxial layer, a speed of rotation of a susceptor and a distribution of heating output for heating of the semiconductor wafer, and additionally, if the coating operation prior to the deposition of the epitaxial layer comprises an etching operation, a volume flow rate of an etching gas, a temperature of the etching gas, a composition of the etching gas and a duration of the etching operation.

The invention further provides a control system for controlling processing apparatuses for processing a semiconductor wafer, comprising a first polishing apparatus in which the semiconductor wafer can be subjected to double-sided polishing in a first polishing operation, a second polishing apparatus in which the semiconductor wafer can be subjected to chemical-mechanical polishing in a second polishing operation, and a coating apparatus in which a layer can be epitaxially deposited on the semiconductor wafer in a coating operation. This control system has been set up to conduct a method of the invention.

The invention further provides a plant for processing a semiconductor wafer, comprising the three processing apparatuses mentioned and a control system of the invention.

With regard to further configurations and advantages of the control system and the plant, in order to avoid repetition, reference is made to the remarks on the method proposed, which are correspondingly applicable here.

Further advantages and embodiments of the invention will be apparent from the description and the appended drawing.

It will be appreciated that the features identified above and those still to be elucidated hereinafter can be used not only in the particular combination indicated but also in other combinations, or on their own, without departing from the scope of the present invention.

The invention is illustrated schematically in the drawing by an exemplary embodiment, and is described below with reference to the drawing.

FIG. 1 shows a schematic of a plant 500 of the invention in a preferred embodiment, with which a method of the invention can be performed. The plant 500 serves for processing of a semiconductor wafer 600 and comprises a first polishing apparatus 100, a second polishing apparatus 200 and a coating apparatus 300. These three processing apparatuses serve for processing of semiconductor wafers 600, which can pass through the individual processing apparatuses successively. For the sake of completeness, it should be mentioned once again at this point that it is also possible for further processing apparatuses to be provided before, between and/or after the processing apparatuses of relevance in the context of the invention that are shown, but these are at least barely of any relevance, if any, for the present invention. For a more detailed description of the individual processing apparatuses, reference is made at this point to FIGS. 2 to 4.

In addition, the plant 500 comprises a control system 400 which can be used together with the three processing apparatuses shown, in order to actuate or to operate them. In the example shown, the control system 400 comprises three individual control units 410, 420 and 430, each of which are provided for actuation or for operation of one of the three processing apparatuses. By means of the respective control unit, it is especially possible to define or set at least one operating parameter in each case for the respective processing apparatus.

For each of the control units 410, 420 and 430, a respective measurement apparatus 411, 421 and 431 is provided in addition. By means of these measurement apparatuses, it is possible to measure a semiconductor wafer after it has been processed in the respective processing apparatus with regard to at least one wafer parameter. For the first polishing apparatus 100, the intention is to polish multiple semiconductor wafers together. It will be apparent that such measurement apparatuses—according to the application—may also be integrated into the respective control unit.

In addition, a central control unit 440 is shown here, which is connected to each of the control units 410, 420 and 430 and to each of the measurement apparatuses 411, 421 and 431. Such a connection comprises at least one connection for data transfer, for example in wired or wireless form. The values determined by the individual measurement apparatuses 411, 421 and 431 can be transmitted in this way to the central control unit 440, such that, by means of the central control unit 440, it is then possible to determine suitable operating parameters for the respective processing apparatuses, which can then be transmitted to the respective control unit 410, 420 or 430. It will be apparent that the determination of the respective operating parameters can also be effected in some other way, for example directly in one of the individual control units.

Figure 2:
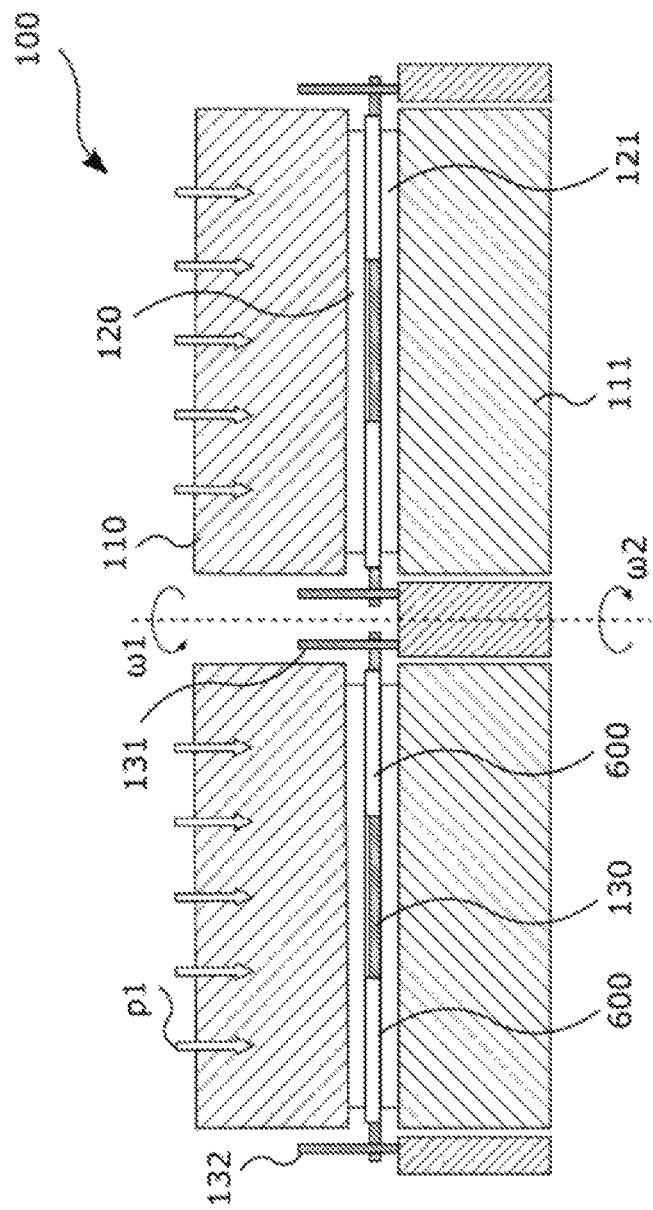
FIG. 2 shows a schematic of a first polishing apparatus as usable in the context of a method of the invention.

FIG. 2 shows, in schematic form and in more detail than in FIG. 1, a first polishing apparatus 100 (for DSP) in a preferred embodiment as usable in the context of a method of the invention, in cross section. In this case, four semiconductor wafers 600 (of which only two in the left-hand half are given a reference numeral) are inserted in corresponding recesses of carrier plates 130 which are moved by means of an inner ring gear 131 and an outer ring gear 132, called a rolling apparatus, between an upper polishing plate 110 and a lower polishing plate 111.

There is a polishing pad 121 on the lower polishing plate 111. There is a polishing pad 120 on the upper polishing plate 110. The polishing plate 110 together with the polishing pad 120 is pressed in the direction of the polishing or contact pressure p1 against the carrier plates 130, the semiconductor wafers 600 and the lower polishing plate 111 with the polishing pad 111. This polishing or contact pressure p1 (including p1(t) variable with time), for example, is a possible operating parameter for the first polishing apparatus. For the sake of completeness, it should also be noted at this point that the faces of the polishing plates 110 and 111 facing the semiconductor wafers 600 are annular.

Useful further operating parameters include the rotational velocities ω1 and ω2 at which the upper polishing plate 110 and the lower polishing plate 111 can be turned or rotated. The two rotational velocities are shown here in opposing directions, but these may also have, for example and according to the application, the same direction of rotation but different magnitudes. It is likewise conceivable to vary the rotational velocities during the operation (i.e. ω1(t) and ω2(t) variable with time)—and likewise the contact or polishing pressure—and/or the composition of the polishing medium and/or the polishing time.

Figure 3:
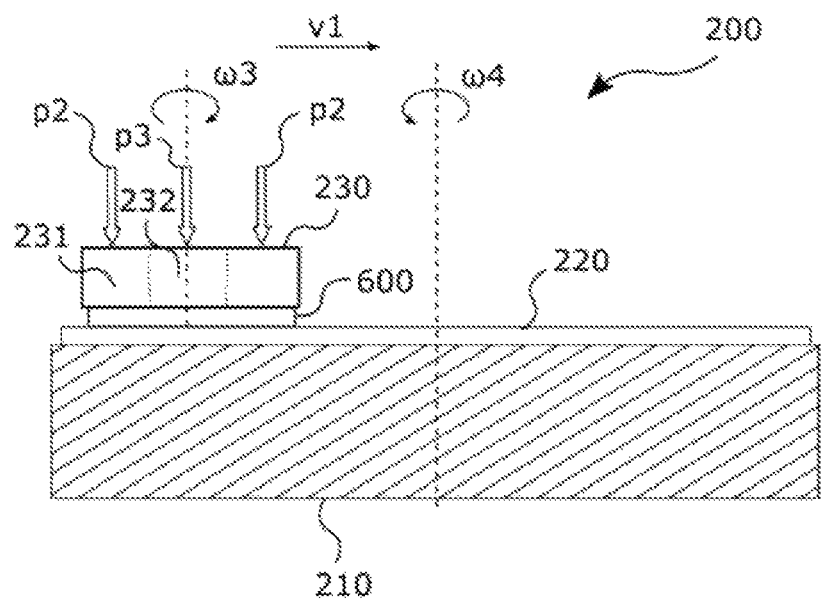
FIG. 3 shows a schematic of a second polishing apparatus as usable in the context of a method of the invention.

FIG. 3 shows, in schematic form and in more detail than in FIG. 1, a second polishing apparatus 200 (for CMP) in a preferred embodiment as usable in the context of a method of the invention, in cross section. The semiconductor wafer 600 here has been applied to a polishing pad 220, which is in turn disposed on a polishing plate 210. By means of a carrier 230, the semiconductor wafer 600 is pressed onto the polishing pad 220. During the polishing, the carrier 230 can be rotated, for example, both about a first axis with the rotational velocity ω3 and about a second axis with the rotational velocity ω4. In addition, the carrier can be moved at a radial velocity v1 (either inward or outward). For polishing, it is possible here to apply a suitable polishing medium to the polishing pads.

More particularly, it is additionally the case that, by means of the carrier 230, the pressures that can be exerted on the semiconductor wafer 600 can be set differently for different regions. In the simplified example shown, a pressure p2 can be exerted in the radially outer region 231, and a pressure p3 in the radially inner region 232. These pressures p2 and p3 in particular are useful operating parameters for the second polishing apparatus. It is likewise conceivable to use both the rotational velocities ω3 and ω4 and the radial velocity v1 additionally or alternatively as operating parameters. If necessary, alternatively or additionally, it is possible to define an altered composition of the polishing medium and/or an altered polishing time. All these parameters can also be defined so as to be variable with time if desired.

The pressures may be chosen such that, for example, the pressure p2 is greater than the pressure p3. More particularly, the pressures may alternatively be set specifically with regard to their magnitude. It will be apparent that even more different regions may be provided in radial direction, in which the pressure is individually adjustable.

Figure 4:
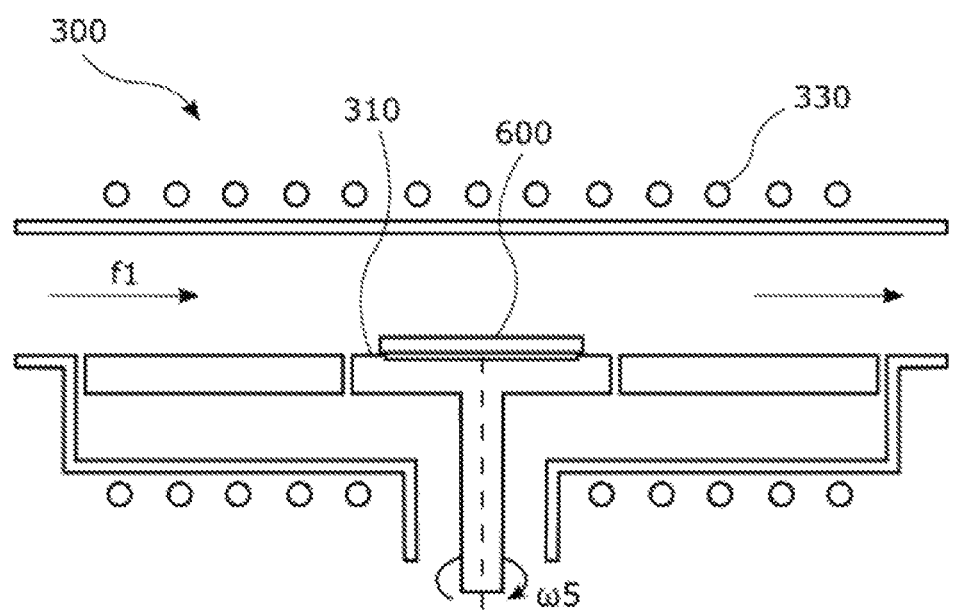
FIG. 4 shows a schematic of a coating apparatus as usable in the context of a method of the invention.

FIG. 4 shows, in schematic form and in more detail than in FIG. 1, a coating apparatus 300 in a preferred embodiment, here in the form of a gas phase epitaxial reactor as usable in the context of a method of the invention, in cross section. In the middle of the coating apparatus 300 there is a susceptor 310 on which a semiconductor wafer 600 to be coated can be disposed, i.e. placed. The susceptor 310 has a depression in the middle, such that the semiconductor wafer 600 lies on the susceptor 310, for example, only in the region of a few millimeters of its edge.

Gas can be passed through the epitaxial reactor 300, in the present example from an opening on the left-hand side as far as an opening on the right-hand side of the epitaxial reactor 300, as indicated by two arrows. By means of heat generators, for example heating lamps 330 at the upper and lower sides of the epitaxial reactor 300, of which one by way of example has been provided with a reference numeral, the gas passed through the epitaxial reactor 300 and the semiconductor wafer can be brought to a desired temperature as required.

For coating of a semiconductor wafer 600, a deposition gas, for example trichlorosilane, optionally mixed with hydrogen, is then passed through the epitaxial reactor 300. Volume flow rate f1 and/or duration of the passage and/or temperature can be adjusted here, for example, according to the desired thickness of the layer to be deposited epitaxially on the semiconductor wafer 600 as operating parameters. In addition, the susceptor 310 with the semiconductor wafer 600 disposed thereon can be rotated about an axis with a definable rotational velocity ω5, which is likewise an additional or alternative operating parameter, as indicated in the figure. In this way, homogeneous deposition of the epitaxial layer can be achieved. If necessary, alternatively or additionally, it is possible to define an altered radial temperature distribution. All these parameters can also be defined so as to be variable with time if desired.

In the context of a coating operation, prior to the passage of the deposition gas, an etching gas that removes material from the semiconductor wafer can be passed through the epitaxial reactor 300 in an etching operation, such that the semiconductor wafer is pretreated in a controlled manner before the actual coating operation.

Preferably, it is possible here to set a volume flow rate of the first etching gas to 4 slm and the gas flow of the carrier gas to 50 slm (slm stands for standard liters per minute).

Figure 5:
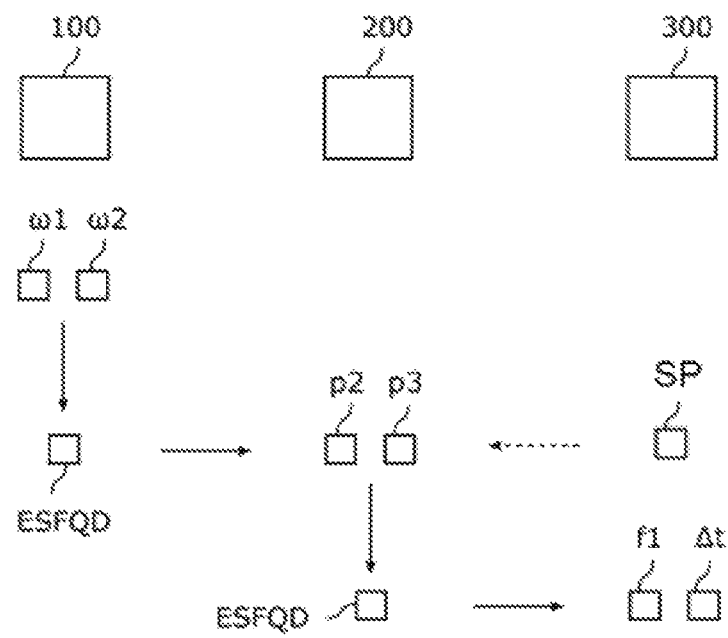
FIG. 5 shows a schematic of a procedure in a method of the invention in a preferred embodiment.

FIG. 5 shows a schematic of a procedure in a method of the invention in a preferred embodiment. First of all, for multiple semiconductor wafers in the first polishing apparatus 100, by way of example, the operating parameters ω1 and ω2 are defined for the rotational velocities. After undergoing the first polishing operation, the $ESFQD_{av}$ value is then determined here as the wafer parameter for each of the semiconductor wafers. As already mentioned, this can be effected in the first polishing apparatus by inter- or extrapolation based on values from multiple semiconductor wafers.

Based on the $ESFQD_{av}$ value determined here, by way of example, the operating parameters p2 and p3, i.e. the pressures with which the semiconductor wafer is pressed against the polishing pad by means of the carrier in various regions, in the second polishing apparatus 200 are then defined. In addition, after undergoing the three processing operations, $ESFQR_{max}$, $SFQR_{max}$, $ZDD_{av}$ and GBIR of the processed semiconductor wafer are determined and a check is made as to whether each of the wafer parameters SP is within a corresponding desired target value range or corresponds to a desired target value. More particularly, failure to comply with a range of target values is taken as cause to alter at least one operating parameter of at least one of the three processing operations for a subsequent semiconductor wafer. For example, the effect of this may be definition of altered operating parameters p2 and p3. In this way, any interaction between the second polishing operation and the coating operation can be taken into account particularly well, and hence the flatness of the semiconductor wafers can be distinctly improved.

Based on the determined $ESFQD_{av}$ value, in the coating apparatus 300, by way of example, the operating parameters f1 and Δt can be defined for the volume flow rate of etching gas and the corresponding duration. Also conceivable is the definition of volume flow rate and/or corresponding duration of deposition gas.

Overall, operating parameters of various processing operations or processing apparatuses are thus defined dependently on one another.

For the sake of completeness, it should also be noted at this point that the procedure shown and described is merely illustrative and also other operating parameters and possibly also other wafer parameters (in each case both operating parameters mentioned herein and other possible operating parameters) can be set or taken into account.

Figure 6:
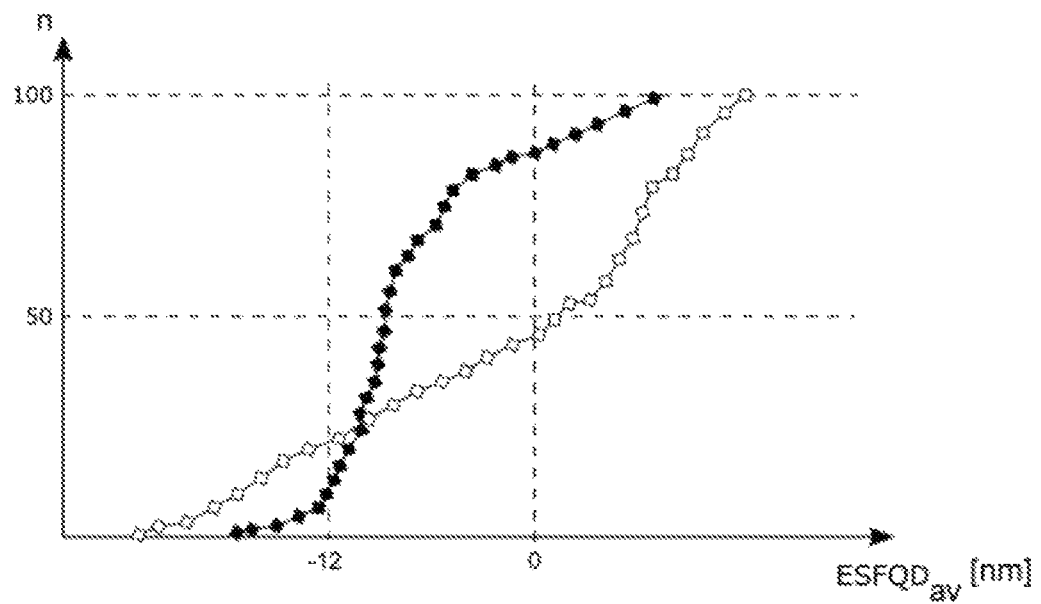
FIG. 6 shows, in simplified form, measurement results for semiconductor wafers after performance of the first polishing operation and the second polishing operation in the sense of the invention.

FIG. 6 shows, in simplified form, measurement results for semiconductor wafers after performance of the first polishing operation and the second polishing operation. For this purpose, the number n of semiconductor wafers processed in cumulated percent is plotted against the $ESFQD_{av}$ value, once after passing through the first polishing apparatus and before passing through the second polishing apparatus (with open diamonds), and once after passing through the second polishing apparatus and before passing through the coating apparatus (with closed diamonds).

Additionally included is a region for the $ESFQD_{av}$ value from −12 to 0 nm, because the performance of the method of the invention leads to the finding that the target should be somewhat less than the middle of this region, in order to obtain $ESFQR_{max}$, $SFQR_{max}$, $ZDD_{av}$ and GBIR within the range of target values desired in each case after undergoing the three processing operations. A strategy that was limited to optimizing the individual processing operations would define operating parameters with the aim of achieving an $ESFQD_{av}$ value of the semiconductor wafers as close as possible to 0 nm after the first and second polishing operations.

By defining at least one operating parameter for the second polishing operation in accordance with the invention, it is possible to keep the $ESFQD_{av}$ value predominantly within the target range. While only about 25% of the semiconductor wafers are within the target range after the first polishing operation, about 80% of the semiconductor wafers are within this desired range after undergoing the second polishing operation. This shows that taking at least one determined wafer parameter into account after the first polishing operation and using this as a basis to define at least one operating parameter for the second polishing operation can compensate very well for any deviations. More particularly, it has been found that it is even possible to achieve up to about 90% or more semiconductor wafers within the desired range.

Figure 7:
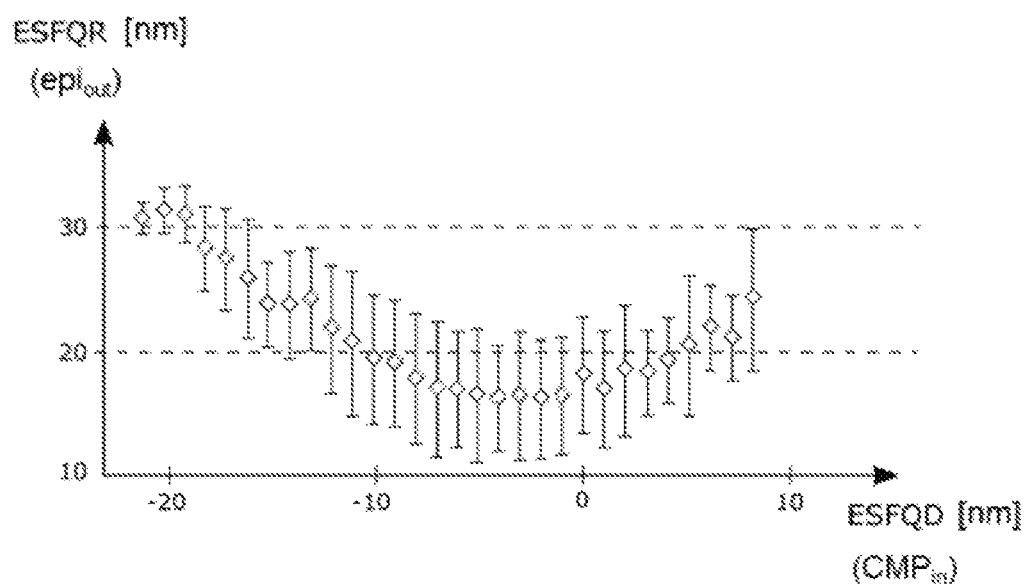
FIG. 7 shows, in simplified form, measurement results on semiconductor wafers after the coating operation ($epi_{out}$) and after the second polishing operation ($CMP_{in}$), dispensing with active control of the coating operation in the sense of the invention.
Figure 8:
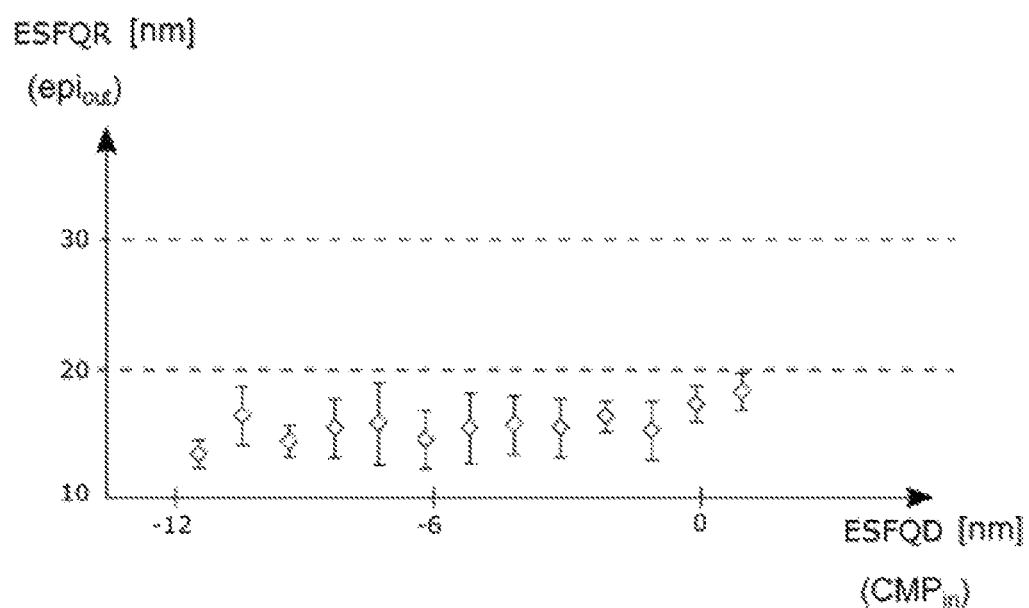
FIG. 8 shows, in simplified form, measurement results on semiconductor wafers after the coating operation ($epi_{out}$) and after the second polishing operation ($CMP_{in}$), with implementation of active control of the coating operation in the sense of the invention.

FIG. 7 and FIG. 8 each show, in simplified form, measurement results on semiconductor wafers after performance of the coating operation ($epi_{out}$) and after the second polishing operation ($CMP_{in}$). The aim here was limited to examining the effect that controlling the coating operation in accordance with the invention has, by comparison with not doing so. If controlling the coating operation in accordance with the invention is dispensed with and, more particularly, differences in coating owing to the fourfold symmetry are not taken into account, only a comparatively small proportion of semiconductor wafers, namely only those with an $ESFQD_{av}$ in the range from about −1 nm to about −6 nm, achieve the best results in relation to the $ESFQR_{max}$ value in nm after undergoing the three processing operations (FIG. 7). By comparison, it is to be expected that all semiconductor wafers having an $ESFQD_{av}$ in the range from about −12 nm to about +3 nm will achieve comparable results with regard to the $ESFQR_{max}$ value (FIG. 8).

Figure 9:
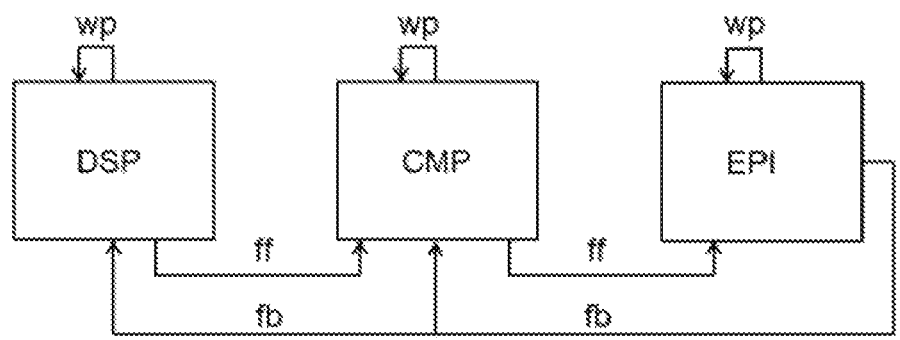
FIG. 9 shows a flow diagram of the method of the invention.

FIG. 9 shows, in summary, the principle of the method of the invention.

For each of the three processing operations, information is provided in order to be able to define at least one operating parameter specific to each processing apparatus:

At least one wafer parameter is determined on the semiconductor wafer to be processed, in order to define at least one operating parameter for the subsequent processing operation (cross-process feedforward, ff).

The actual state of the respective processing apparatus is assessed, and on this basis at least one operating parameter of the processing apparatus being assessed is defined for the processing of a subsequent semiconductor wafer with this processing apparatus (within-process feedback, wp).

After undergoing the three processing operations, $ESFQR_{max}$, $SFQR_{max}$, $ZDD_{av}$ and GBIR of the processed semiconductor wafer are considered and compared with respective target values in order to define at least one operating parameter for one or more of the three processing operations for processing of a subsequent semiconductor wafer (cross-process feedback, fb).

The effect of the invention was also tested practically. Semiconductor wafers were produced from monocrystalline silicon having an epitaxial layer of monocrystalline silicon by the method of the invention. The semiconductor wafers had {100} orientation and a diameter of 300 mm, and the epitaxial layer had a thickness of 2.75 μm. The table below lists properties of two representatives from the semiconductor wafers produced. DT/DL denote the dopant type and dopant level of the semiconductor wafer (SW) and of the epitaxial layer (EL).

TABLE

| DT/DL SW | DT/DL EL | ESFQR$_{max}$[1) | SFQR$_{max}$[2) | ZDD$_{av}$[3) | GBIR[4) |
|---|---|---|---|---|---|
| p⁻ | p | 10 nm | 9 nm | −6 nm/mm² | 74 nm |
| p⁺ | p | 10 nm | 8 nm | −1 nm/mm² | 41 nm |

[1)ESFQR$_{max}$ with an edge exclusion of 2 mm, an edge division into 72 sectors and a sector length of 30 mm, determined to SEMI M67;
[2)SFQRmax with an edge exclusion of 2 mm and a site area of 26 mm × 8 mm, determined to SEMI M1, SEMI MF 1530 and SEMI M49;
[3)ZDD$_{av}$ at a radius position of 148 mm, determined to SEMI M68;
[4)GBIR with an edge exclusion of 2 mm, determined to SEMI M1, SEMI MF 1530 and SEMI 49.

The invention claimed is:

1. A method of processing a semiconductor wafer, comprising minimally three processing operations: a first polishing operation in which the semiconductor wafer is subjected to double-sided polishing, followed by a second polishing operation in which the semiconductor wafer is subjected to chemical-mechanical polishing, followed by a coating operation in which the semiconductor wafer is subjected to epitaxial deposition of a layer,
the method comprising:
defining at least one operating parameter for each of the three processing operations, based, for each operating parameter definition, on at least one wafer parameter which is determined on the semiconductor wafer processed, on an actual state of a processing apparatus with which the respective processing operation is conducted, and on an optimization of wafer flatness parameters after undergoing all three processing operations, and not an optimization of the wafer flatness parameters after every individual processing step of the three processing operations, wherein one or more semiconductor wafers having an ESFQR$_{max}$ value at an edge exclusion of 2 mm, an edge division into 72 sectors and a sector length of 30 mm of not greater than 10 nm, an SFQR$_{max}$ value at an edge exclusion of 2 mm and a site area of 26 mm×8 mm of not greater than 10 nm, a ZDD$_{av}$ value at a radius position of 148 mm having a magnitude of not greater than 10 nm/mm², and a GBIR value at an edge exclusion of 2 mm of not greater than 0.10 µm are obtained.

2. The method of claim 1, wherein the wafer parameter determined is obtained from data from a flatness measurement.

3. The method of claim 1, wherein at least one wafer parameter determined is ESFQD$_{av}$.

4. The method of claim 1, wherein the wafer flatness parameters are one or more of ESFQR$_{max}$, SFQR$_{max}$, ZDD$_{av}$, and GBIR.

5. The method of claim 1, wherein, for the first polishing operation, at least one corresponding operating parameter is established, selected from the group consisting of a polishing pressure, a polishing time, a speed of rotation of an upper polishing plate, a speed of rotation of a lower polishing plate, a speed of rotation of an inner drive ring, a speed of rotation of an outer drive ring, a temperature of the upper polishing plate, a temperature of the lower polishing plate, a composition of a polishing medium, a volume flow rate of the polishing medium, a temperature of the polishing medium, a pH of the polishing medium, a target differential of central thickness of the polished semiconductor wafer, and a mean thickness of a rotor disk used for polishing.

6. The method of claim 5, wherein the at least one wafer parameter is determined by measurement on the particular semiconductor wafer or is determined using an evaluation based on the measurement of a multitude of semiconductor wafers processed.

7. The method of claim 1, wherein, for the second polishing operation, at least one corresponding operating parameter is established, is selected from the group consisting of a radial distribution of a polishing pressure, a polishing time, a speed of rotation of a polishing plate, a speed of rotation of a carrier, a composition of a polishing medium, a volume flow rate of the polishing medium, a pH of the polishing medium, a temperature of the polishing plate, a temperature of the polishing medium, and a dressing of a polishing pad.

8. The method of claim 1, wherein, for the coating operation, at least one corresponding operating parameter is established, selected from the group consisting of a volume flow rate of a deposition gas, a temperature of the deposition gas, a composition of the deposition gas, a duration of the deposition of the epitaxial layer, a speed of rotation of a susceptor, a distribution of heating output for heating of the semiconductor wafer, and additionally, if the coating operation prior to the deposition of the epitaxial layer comprises an etching operation, a volume flow rate of an etching gas, a temperature of the etching gas, a composition of the etching gas and a duration of the etching operation.

9. The method of claim 8, wherein the etching gas is passed through the coating apparatus in the course of the etching operation.

10. The method of claim 1, wherein, for at least one of the processing operations, at least one corresponding operating parameter is defined based on a target value of the at least one wafer parameter after undergoing at least one of the subsequent processing operations.

11. The method of claim 1, wherein, for the second polishing operation, at least one operating parameter is defined such that, in a radial direction of the semiconductor wafer, regions are polished differently in the processing, via definition of different pressures onto different regions of the semiconductor wafer.

12. A control system for controlling processing apparatuses for processing a semiconductor wafer, comprising a first polishing apparatus in which the semiconductor wafer is subjected to double-sided polishing in a first polishing operation, a second polishing apparatus in which the semiconductor wafer is subjected to chemical-mechanical polishing in a second polishing operation, and a coating apparatus in which a layer is epitaxially deposited on the semiconductor wafer in a coating operation, wherein the control system conducts the method of claim 1.

13. A plant for processing a semiconductor wafer, having minimally three processing apparatuses for processing operations, comprising a first polishing apparatus in which the semiconductor wafer can be subjected to double-sided polishing in a first polishing operation, a second polishing apparatus in which the semiconductor wafer can be subjected to chemical-mechanical polishing in a second polishing operation, and a coating apparatus in which a layer can be epitaxially deposited on the semiconductor wafers in a coating operation, and a control system of claim 12.

14. A semiconductor wafer, having an ESFQR$_{max}$ value at an edge exclusion of 2 mm, an edge division into 72 sectors and a sector length of 30 mm of not greater than 10 nm, an SFQR$_{max}$ value at an edge exclusion of 2 mm and a site area of 26 mm×8 mm of not greater than 10 nm, a ZDD$_{av}$ value at a radius position of 148 mm having a magnitude of not greater than 10 nm/mm$^2$, and a GBIR value at an edge exclusion of 2 mm of not greater than 0.10 μm.

* * * * *